United States Patent
Akiyama

(10) Patent No.: US 9,559,226 B2
(45) Date of Patent: Jan. 31, 2017

(54) SOLID-STATE IMAGING APPARATUS AND ELECTRONIC APPARATUS

(71) Applicant: Sony Corporation, Tokyo (JP)

(72) Inventor: Kentaro Akiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 3 days.

(21) Appl. No.: 14/313,644

(22) Filed: Jun. 24, 2014

(65) Prior Publication Data

US 2015/0008554 A1 Jan. 8, 2015

(30) Foreign Application Priority Data

Jul. 3, 2013 (JP) ................................ 2013-139833

(51) Int. Cl.
| | |
|---|---|
| *H01L 31/0232* | (2014.01) |
| *H01L 31/0216* | (2014.01) |
| *G02B 6/42* | (2006.01) |
| *H01L 27/146* | (2006.01) |

(52) U.S. Cl.
CPC ........... *H01L 31/02327* (2013.01); *G02B 6/42* (2013.01); *H01L 27/14623* (2013.01); *H01L 27/14627* (2013.01); *H01L 27/14629* (2013.01); *H01L 31/02164* (2013.01); *G02B 6/4204* (2013.01)

(58) Field of Classification Search
CPC ..... H01L 31/0232; H01L 27/00; H01L 31/118
USPC ........................... 257/432, E31.127; 348/273
See application file for complete search history.

(56) References Cited

U.S. PATENT DOCUMENTS

| | | | |
|---|---|---|---|
| 2001/0054677 A1* | 12/2001 | Nakashima | ................. 250/208.1 |
| 2004/0132262 A1* | 7/2004 | Ayabe et al. | ................. 438/428 |
| 2009/0225204 A1* | 9/2009 | Inaba et al. | ................... 348/273 |
| 2010/0078745 A1* | 4/2010 | Wano et al. | ................... 257/432 |
| 2011/0037134 A1* | 2/2011 | Sugino | .............. H01L 27/14605 |
| | | | 257/432 |
| 2012/0199927 A1* | 8/2012 | Shimotsusa | ....... H01L 27/14623 |
| | | | 257/432 |
| 2012/0250166 A1* | 10/2012 | Idei et al. | ...................... 359/722 |
| 2013/0001724 A1* | 1/2013 | Masuda | ............ H01L 27/14623 |
| | | | 257/432 |
| 2014/0001589 A1* | 1/2014 | Fukuda | ............. H01L 27/14623 |
| | | | 257/432 |
| 2014/0078349 A1* | 3/2014 | Velichko et al. | ............. 348/241 |

FOREIGN PATENT DOCUMENTS

| | | |
|---|---|---|
| JP | 2002-314062 | 10/2002 |
| JP | 2012-151215 | 8/2012 |

* cited by examiner

*Primary Examiner* — Daniel Luke
*Assistant Examiner* — Khatib Rahman
(74) *Attorney, Agent, or Firm* — Michael Best & Friedrich LLP

(57) ABSTRACT

A solid-state imaging apparatus includes a phase difference detection pixel including a photoelectric conversion section that is formed on a semiconductor substrate and configured to photoelectrically convert incident light, a waveguide configured to guide the incident light to the photoelectric conversion section, and a light-shielding section that is formed in vicinity of an opening of the waveguide and configured to shield a part of the incident light that enters the waveguide.

17 Claims, 7 Drawing Sheets

SOLID-STATE IMAGING APPARATUS AND ELECTRONIC APPARATUS

CROSS REFERENCE TO RELATED APPLICATIONS

This application claims the benefit of Japanese Priority Patent Application JP 2013-139833 filed Jul. 3, 2013, the entire contents of which are incorporated herein by reference.

BACKGROUND

The present technology relates to a solid-state imaging apparatus and an electronic apparatus and more particularly to a solid-state imaging apparatus and an electronic apparatus that can improve easiness of fabrication and a distance measuring accuracy.

A digital camera with a complementary metal oxide semiconductor (CMOS) type solid-state imaging apparatus, which is provided with a distance detecting function for auto focus (AF) is, for example, known in the related art.

Specifically, there is proposed a technique in which a single on-chip lens and a plurality of photoelectric conversion sections are provided in some pixels of a solid-state imaging apparatus, to thereby provide a function of detecting a distance by a phase difference method (for example, see Japanese Patent Application Laid-open No. 2002-314062 (hereinafter, referred to as Patent Document 1).

There is also proposed a technique in which, in a distance measuring pixel including a single on-chip lens and a plurality of photoelectric conversion sections, a main waveguide equivalent to a typical imaging pixel is provided on a side of the on-chip lens and sub-waveguides as many as the number of photoelectric conversion sections are provided on a side of the photoelectric conversion sections (for example, see Japanese Patent Application Laid-open No. 2012-151215 (hereinafter, referred to as Patent Document 2). With such a structure, it is possible to reliably guide light from the on-chip lens to the photoelectric conversion sections and to improve a distance measuring accuracy.

Further, there is generally known a technique in which, in a distance measuring pixel, light that enters a photoelectric conversion section is shielded by a light-shielding film provided above the photoelectric conversion section and the distance is detected by a phase difference method.

SUMMARY

However, in the structure described in Patent Document 2, there is a need for dividing the manufacturing process into a manufacturing process for the distance measuring pixel and a manufacturing process for the imaging pixel including only the waveguide and there is also a fear that the fabrication becomes difficult if the sub-waveguide is reduced in diameter due to reduction of the pixel size.

In a structure including a plurality of photoelectric conversion sections in a single pixel, the area of each photoelectric conversion section becomes smaller for ensuring an element separation area. A signal amount of each photoelectric conversion section decreases and there is a fear that the distance measuring accuracy is lowered.

In addition, when the light-shielding film is provided above the photoelectric conversion section in the pixel including the waveguide, light that have propagated in the waveguide and entered the photoelectric conversion section is mixed with light from various angles. As a result, there is a fear that the distance measuring accuracy is lowered.

In view of the above-mentioned circumstances, it is desirable to improve the easiness of fabrication and the distance measuring accuracy.

According to an embodiment of the present technology, there is provided a solid-state imaging apparatus including a phase difference detection pixel including a photoelectric conversion section that is formed on a semiconductor substrate and configured to photoelectrically convert incident light, a waveguide configured to guide the incident light to the photoelectric conversion section, and a light-shielding section that is formed in vicinity of an opening of the waveguide and configured to shield a part of the incident light that enters the waveguide.

The phase difference detection pixel may further include an on-chip lens having a light collection point in vicinity of the opening of the waveguide.

The phase difference detection pixel may further include a light-shielding wall that is formed in a periphery of the waveguide and configured to shield at least a part of light that leaks out of the waveguide.

The light-shielding wall may be formed to surround the entire periphery of the waveguide.

The light-shielding wall may be formed to surround a part of the periphery of the waveguide.

The phase difference detection pixel may further include a charge retention section that is formed on the semiconductor substrate and configured to retain a charge photoelectrically converted by the photoelectric conversion section, and the light-shielding wall may be configured to shield light that leaks out of the waveguide to the charge retention section.

The light-shielding section may be formed as a wiring layer.

The waveguide may include a core configured to propagate light and a clad configured to confine the light propagating in the core, and the light-shielding section may be formed to be held in contact with the core in vicinity of the opening of the waveguide.

The core and the clad may be each formed of an inorganic film, and the core may have a refractive index higher than a refractive index of the clad.

The solid-state imaging apparatus may further include a pixel array section including the phase difference detection pixel arranged in a scattered manner among a plurality of imaging pixels two-dimensionally arranged in rows, and the plurality of imaging pixels may each include at least the photoelectric conversion section, the waveguide, and the on-chip lens.

According to an embodiment of the present technology, there is provided an electronic apparatus including a solid-state imaging apparatus including a phase difference detection pixel including a photoelectric conversion section that is formed on a semiconductor substrate and configured to photoelectrically convert incident light, a waveguide configured to guide the incident light to the photoelectric conversion section, and a light-shielding section that is formed in vicinity of an opening of the waveguide and configured to shield a part of the incident light that enters the waveguide.

In the embodiment of the present technology, in the phase difference detection pixel, the light-shielding section is formed in vicinity of the opening of the waveguide and the part of the incident light that enters the waveguide configured to guide the incident light to the photoelectric conversion section.

According to the embodiment of the present technology, it is possible to improve the easiness of fabrication and the distance measuring accuracy.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, an embodiment of the present disclosure will be described with reference to the drawings.

[Functional Configuration Example of Electronic Apparatus]

Figure 1:
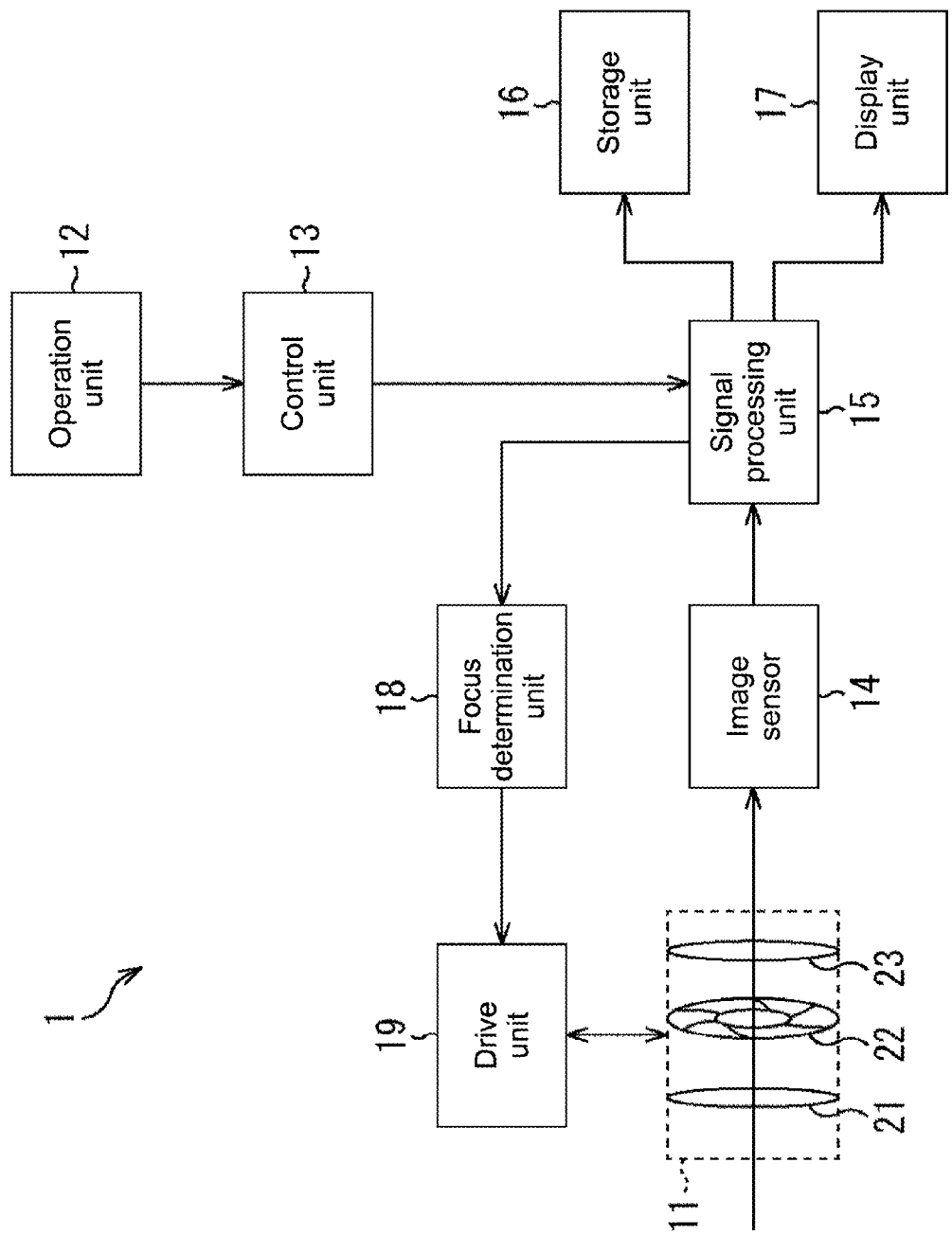
FIG. 1 is a block diagram showing an embodiment of an electronic apparatus including an image sensor to which the present technology is applied.

FIG. 1 is a block diagram showing an embodiment of an electronic apparatus including an image sensor to which the present technology is applied.

An electronic apparatus 1 shown in FIG. 1 is configured as a digital camera, a cellular terminal having an imaging function, or the like. By an auto focus (AF) function, a subject is imaged and a capture image is generated and recorded as a still image or a moving image. Hereinafter, it is assumed that still images are mainly recorded.

The electronic apparatus 1 includes a lens unit 11, an operation unit 12, a control unit 13, an image sensor 14, a signal processing unit 15, a storage unit 16, a display unit 17, a focus determination unit 18, and a drive unit 19.

The lens unit 11 collects light from a subject (subject light). The subject light collected by the lens unit 11 is incident upon the image sensor 14.

The lens unit 11 includes a zoom lens 21, a diaphragm 22, and a focus lens 23.

The zoom lens 21 is moved in an optical axis direction due to driving of the drive unit 19, to thereby change the focal distance to adjust the magnification of the subject included in the capture image. The diaphragm 22 changes the degree of opening due to driving of the drive unit 19 to adjust the light amount of the subject light incident upon the image sensor 14. The focus lens 23 is moved in the optical axis direction due to driving of the drive unit 19, to thereby adjust the focus.

The operation unit 12 receives an operation made by a user. For example, when a shutter button (not shown) is pressed, the operation unit 12 supplies an operation signal indicating this operation to the control unit 13.

The control unit 13 controls operations of the respective units of the electronic apparatus 1.

For example, when receiving the operation signal indicating the press of the shutter button, the control unit 13 supplies an instruction to record a still image to the signal processing unit 15. In order to display a live view image that is a real-time image of the subject on the display unit 17, the control unit 13 supplies an instruction to generate a live view image to the signal processing unit 15.

In order to perform a focus determination by a phase difference detection method, the control unit 13 supplies an instruction of an operation of performing the focus determination (phase difference detection operation) to the signal processing unit 15. The phase difference detection method means a focus detection method in which light that has passed through an imaging lens is pupil-divided to form a pair of image, a distance between the formed images (amount of displacement between images) is measured (phase difference is detected), and thus the degree of focus is detected.

The image sensor 14 is a solid-state imaging apparatus that photoelectrically converts received subject light into an electrical signal.

The image sensor 14 is, for example, a complementary metal oxide semiconductor (CMOS) image sensor or a charge coupled device (CCD) image sensor. The image sensor 14 includes a pixel array section in which a plurality of pixels (imaging pixels) that generate signals for generating a capture image based on received subject light and a plurality of distance measuring pixels for distance detection, in other words, pixels (phase difference detection pixels) that generate signals for performing a phase difference detection are arranged. The image sensor 14 supplies the electrical signal generated by the photoelectric conversion to the signal processing unit 15.

The signal processing unit 15 subjects the electrical signal supplied from the image sensor 14 to various types of signal processing.

For example, when an instruction to record a still image is supplied from the control unit 13, the signal processing unit 15 generates data of the still image (still image data) and supplies the still image data to the storage unit 16. When an instruction to generate a live view image is supplied from the control unit 13, the signal processing unit 15 generates, based on output signals from the imaging pixels in the image sensor 14, data of the live view image (live view image data) and supplies the live view image data to the display unit 17.

When an instruction of a phase difference detection operation is supplied from the control unit 13, the signal processing unit 15 generates, based on output signals from the phase difference detection pixels in the image sensor 14, data for detecting a phase difference (phase difference detection data) and supplies the phase difference detection data to the focus determination unit 18.

The storage unit 16 records image data supplied from the signal processing unit 15. The storage unit 16 is configured as one or more removable recording media, for example, a disc such as a digital versatile disk (DVD) and a semiconductor memory such as a memory card. Those recording media may be incorporated in the electronic apparatus 1 or may be removable from the electronic apparatus 1.

The display unit 17 displays an image based on the image data supplied from the signal processing unit 15. For example, the display unit 17 displays a live view image when the live view image data is supplied from the signal processing unit 15. The display unit 17 is, for example, a liquid crystal display (LCD) or an organic electro-luminescence (EL) display.

The focus determination unit 18 determines, based on the phase difference detection data supplied from the signal processing unit 15, whether or not an object as a target to be focused (focus target object) is in focus. If an object located in a focus area is in focus, the focus determination unit 18 supplies information indicating that it is in-focus to the drive unit 19 as a focus determination result. If the focus target object is not in focus, the focus determination unit 18 calculates an out-of-focus amount (defocus amount) and supplies information indicating the calculated defocus amount to the drive unit 19 as the focus determination result.

The drive unit 19 drives the zoom lens 21, the diaphragm 22, and the focus lens 23. For example, the drive unit 19 calculates, based on the focus determination result supplied from the focus determination unit 18, a driving amount of the focus lens 23 and moves the focus lens 23 according to the calculated driving amount.

Specifically, the drive unit 19 maintains the current position of the focus lens 23 if it is in focus. If it is not in focus, the drive unit 19 calculates a driving amount (moving distance) based on the focus determination result indicating the defocus amount and the position of the focus lens 23 and moves the focus lens 23 according to the driving amount.

[Pixel Arrangement of Image Sensor]

Next, referring to FIG. 2, pixel arrangement of the image sensor 14 will be described.

Figure 2:
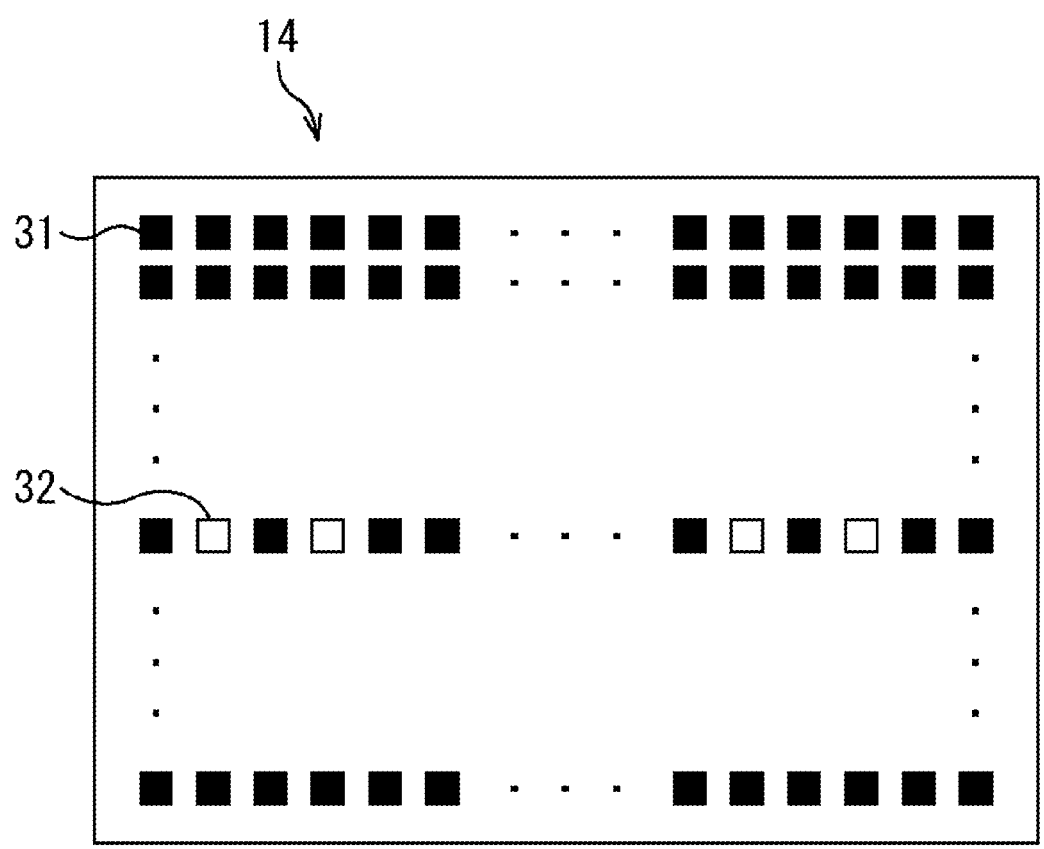
FIG. 2 is a diagram explaining pixel arrangement of the image sensor.

In FIG. 2, it is assumed that a left-to-right direction (row direction) is an X-direction, a down-to-up direction (column direction) is a Y-direction, and a back-to-front direction is a Z-direction.

As shown in FIG. 2, in the image sensor 14 (pixel array section), a plurality of imaging pixels 31 indicated by the black squares are two-dimensionally arranged in a matrix form in an XY-plane. The imaging pixels 31 are composed of R-, G-, and B-pixels. These pixels are regularly arranged according to the Bayer array.

Further, in the image sensor 14, a plurality of phase difference detection pixels 32 indicated by the white squares are arranged in a scattered manner among the plurality of imaging pixels 31 two-dimensionally arranged in rows. Specifically, the phase difference detection pixels 32 are composed of pixels in which light is shielded on a right-hand side in the X-direction of the light reception area and pixels in which light is shielded on a left-hand side in the X-direction of the light reception area. These pixels are regularly arranged according to a particular pattern by replacing some of the imaging pixels 31 by such pixels in each of predetermined columns of the pixel columns in the image sensor 14. Note that the arrangement of the imaging pixels 31 and the phase difference detection pixels 32 in the image sensor 14 is not limited thereto and other patterns are also possible.

Next, detailed configurations of the imaging pixel 31 and the phase difference detection pixel 32 in the image sensor 14 will be described.

[Configuration Example of Imaging Pixel]

Figure 3:
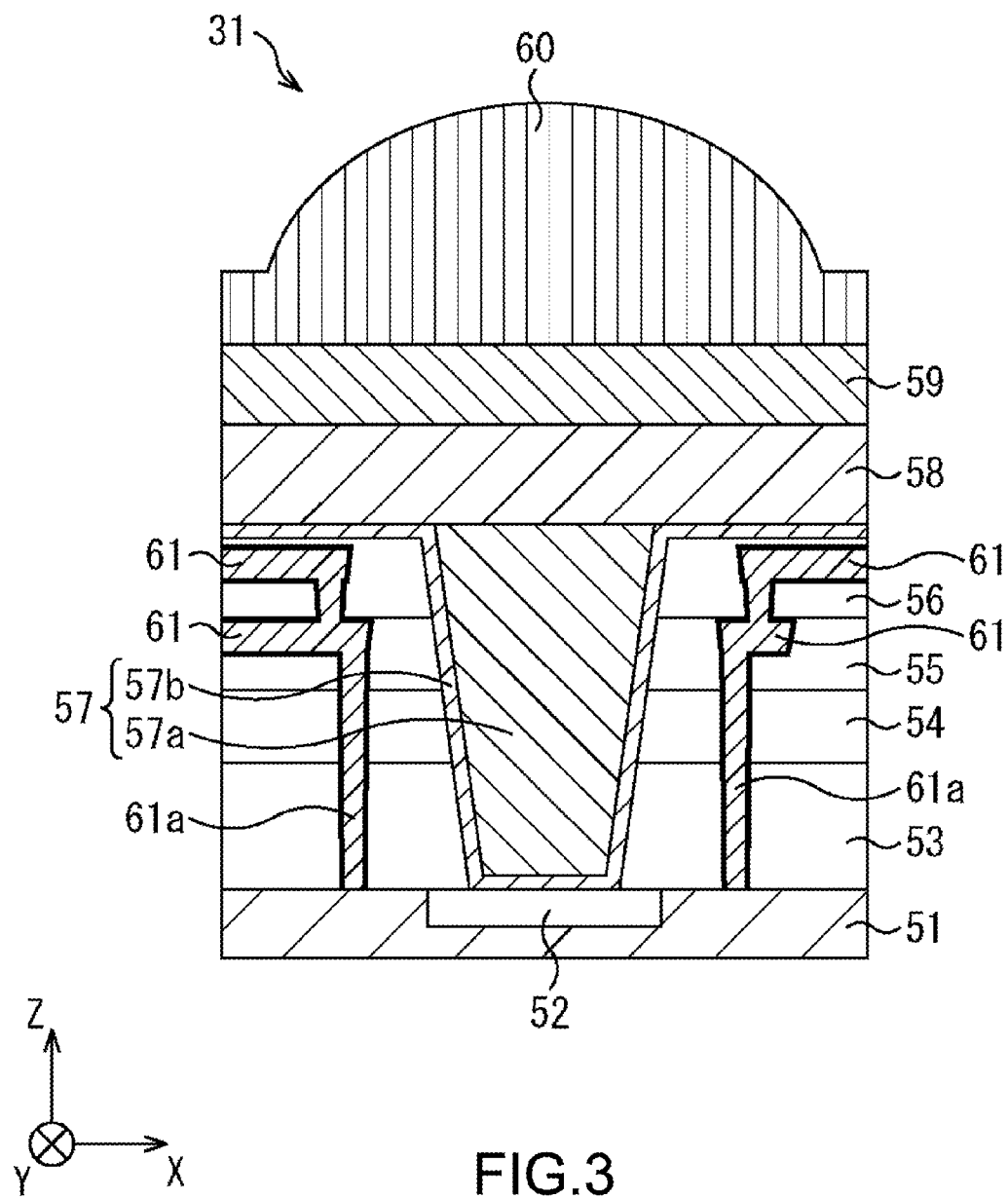
FIG. 3 is a cross-sectional view showing a configuration example of an imaging pixel.

FIG. 3 is a cross-sectional view showing a configuration example of the imaging pixel 31 in the image sensor 14.

As shown in FIG. 3, in the imaging pixel 31, a photoelectric conversion section 52 that photoelectrically converts incident light is formed by ion implantation on a semiconductor substrate 51 made of, for example, Si. Inter-layer insulation films 53 to 56 are formed above the semiconductor substrate 51. A waveguide 57 that guides the incident light to the photoelectric conversion section 52 is formed in the inter-layer insulation films 53 to 56 and above the photoelectric conversion section 52. A planarization film 58, a color filter 59 having spectral properties corresponding to the R-pixels, the G-pixels, and the B-pixels, and an on-chip lens 60 are formed above the inter-layer insulation films 53 to 56 and the waveguide 57.

The on-chip lens 60 is designed to have a light collection point in vicinity of the opening of the waveguide 57. The incident light that has entered the on-chip lens 60 enters the waveguide 57 through the color filter 59 and the planarization film 58.

The waveguide 57 is composed of a core 57a that propagates light and a clad 57b that confines the light propagating in the core 57a. The core 57a and the clad 57b are made of material having a transmittance of 80% or higher against a wavelength band of the incident light. For example, the core 57a is formed of an inorganic film of SiN, SiC, or the like and the clad 57b is formed of an inorganic film of SiO2 or the like. The core 57a is set to have a refractive index higher than a refractive index of the clad 57b.

Note that the inter-layer insulation films 53 to 56 are formed of material having a refractive index lower than both the refractive indexes of the core 57a and the clad 57b constituting the waveguide 57.

With such a structure, the waveguide 57 suppresses leakage of the incident light out of the waveguide 57 and guides the incident light to a light reception surface of the photoelectric conversion section 52. Thus, light collection efficiency of the photoelectric conversion section 52 can be improved.

In addition, in the imaging pixel 31, a light-shielding wall 61a that shields the light that have leaked out of the waveguide 57 is provided as a part of a wiring layer 61 in a periphery of the waveguide 57.

Specifically, the light-shielding wall 61a is formed to surround the entire periphery of the waveguide 57. The light-shielding wall 61a has, for example, a columnar shape. The light-shielding wall 61a is formed of metal such as W, Ti, Al, Cu, TiN, Ta, and TaN.

Note that the light-shielding wall 61a may have any shape as long as it has a structure surrounding the waveguide 57. Other than the columnar shape, the light-shielding wall 61a may have a quadrangular prism shape or an octagonal prism shape, for example. In the case where the light-shielding wall 61a has a columnar shape, a bottom surface of the column may have an ellipse shape.

With such a structure, it is possible to prevent the light that have leaked out of the waveguide 57 from entering adjacent pixels to become mixed color components and to more efficiently guide the incident light to the light reception surface of the photoelectric conversion section 52 even when the pixels are reduced in size.

[Configuration Example of Phase Difference Detection Pixel]

Next, referring to FIG. 4, a configuration example of the phase difference detection pixel 32 will be described.

Note that descriptions of sections of the phase difference detection pixel 32 shown in FIG. 4, which are formed in the same manner as those of the imaging pixel 31 described with reference to FIG. 3 will be omitted.

In the phase difference detection pixel 32, a light-shielding section 62 that shields a part of incident light that enters the waveguide 57 is formed in vicinity of the opening of the waveguide 57.

Specifically, the light-shielding section 62 is formed to be held in contact with an upper end surface of the core 57a in vicinity of the opening of the waveguide 57. The light-shielding section 62 is formed of metal such as W, Ti, Al, Cu, TiN, Ta, and TaN.

Figure 4:
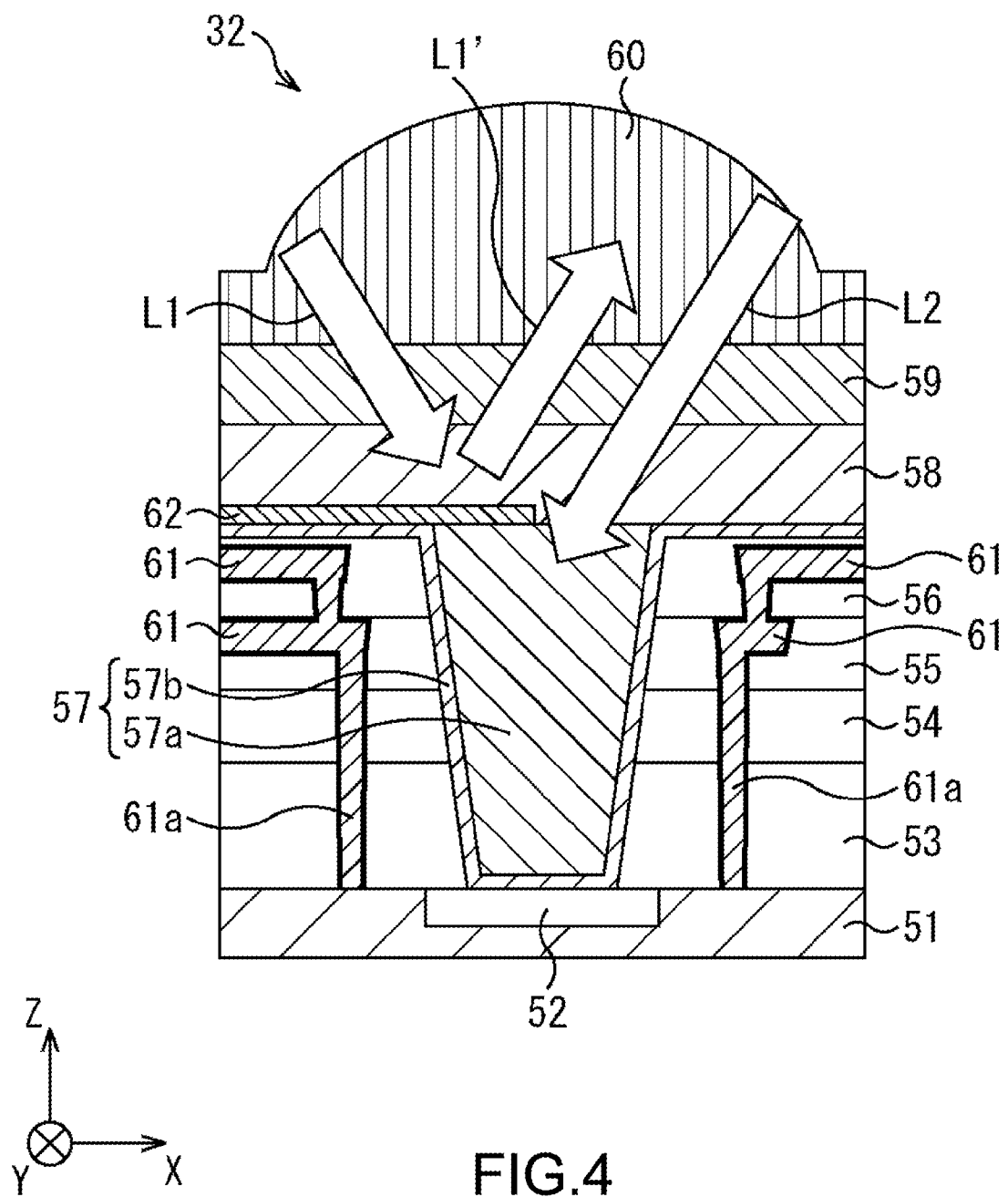
FIG. 4 is a cross-sectional view showing a configuration example of a phase difference detection pixel.

In the phase difference detection pixel 32 shown in FIG. 4, the light-shielding section 62 shields light in the left half of the opening of the waveguide 57. In some phase difference detection pixels 32, light in the right half of the opening of the waveguide 57 is shielded by the light-shielding section 62.

As shown in FIG. 4, a part of incident light L1 that have passed through the on-chip lens 60 and entered in a first direction is guided by the waveguide 57 to the photoelectric conversion section 52 and most of the incident light L1 is reflected by the light-shielding section 62 as reflection light L1' and does not reach the photoelectric conversion section 52. On the other hand, most of incident light L2 that have passed through the on-chip lens 60 and entered in a second direction passes through a portion of the opening of the waveguide 57 (opening portion), which is not shielded by the light-shielding section 62, and is guided by the waveguide 57 to the photoelectric conversion section 52.

The rate of the incident light L1 and L2 propagated to the photoelectric conversion section 52 is different depending on their incident angles.

Also in the phase difference detection pixel 32, an on-chip lens 60 is designed to have a light collection point in vicinity of the opening of the waveguide 57 as in the imaging pixel 31. In addition, by appropriately designing the opening portion of the waveguide 57, the diameter of the waveguide 57, and the distance between the waveguide 57 and the light-shielding wall 61a, it is possible to increase the rate of amount of the incident light L1 and L2 propagated to the photoelectric conversion section 52 to improve light splitting characteristics.

As described above, the phase difference detection pixel 32 has a structure in which the light-shielding section 62 is merely provided to the structure of the imaging pixel 31. Therefore, it is unnecessary to divide the manufacture process into a manufacturing process for the phase difference detection pixels 32 and a manufacturing process for the imaging pixels 31. Thus, it is possible to improve the easiness of fabrication.

Further, the phase difference detection pixel 32 can have a structure in which one photoelectric conversion section is provided to one pixel. Therefore, the signal amount of each photoelectric conversion section is not reduced and further the light splitting characteristics can be improved by optimizing the design of the waveguide 57. Therefore, it is possible to improve the distance measuring accuracy.

Figure 5:
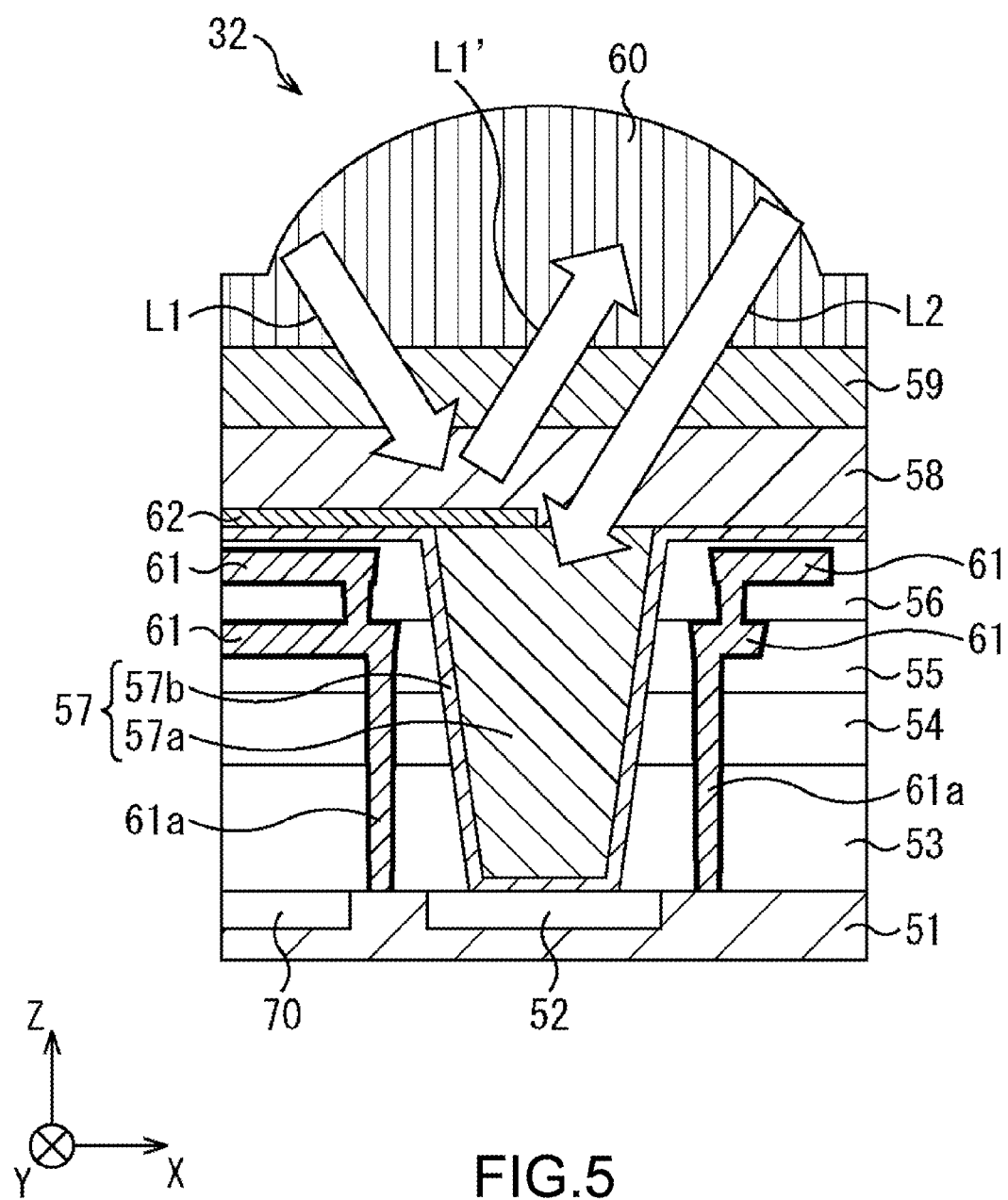
FIG. 5 is a cross-sectional view showing another configuration example of the phase difference detection pixel.

In addition, in the solid-state imaging apparatus that transfers and retains charges in all pixels at the same time and realizes a global shutter function of simultaneously exposing all the pixels, a charge retention section 70 that retains charges photoelectrically converted by the photoelectric conversion section 52 is formed in the semiconductor substrate 51, for example, as in the phase difference detection pixel 32 shown in FIG. 5.

In the phase difference detection pixel 32 of FIG. 5, light that have leaked out of the waveguide 57 is shielded by the light-shielding wall 61a and it is possible to prevent the light from entering the charge retention section 70 to become noise components.

[Another Configuration Example of Phase Difference Detection Pixel]

Next, referring to FIG. 6, another configuration example of the phase difference detection pixel 32 will be described.

Figure 6:
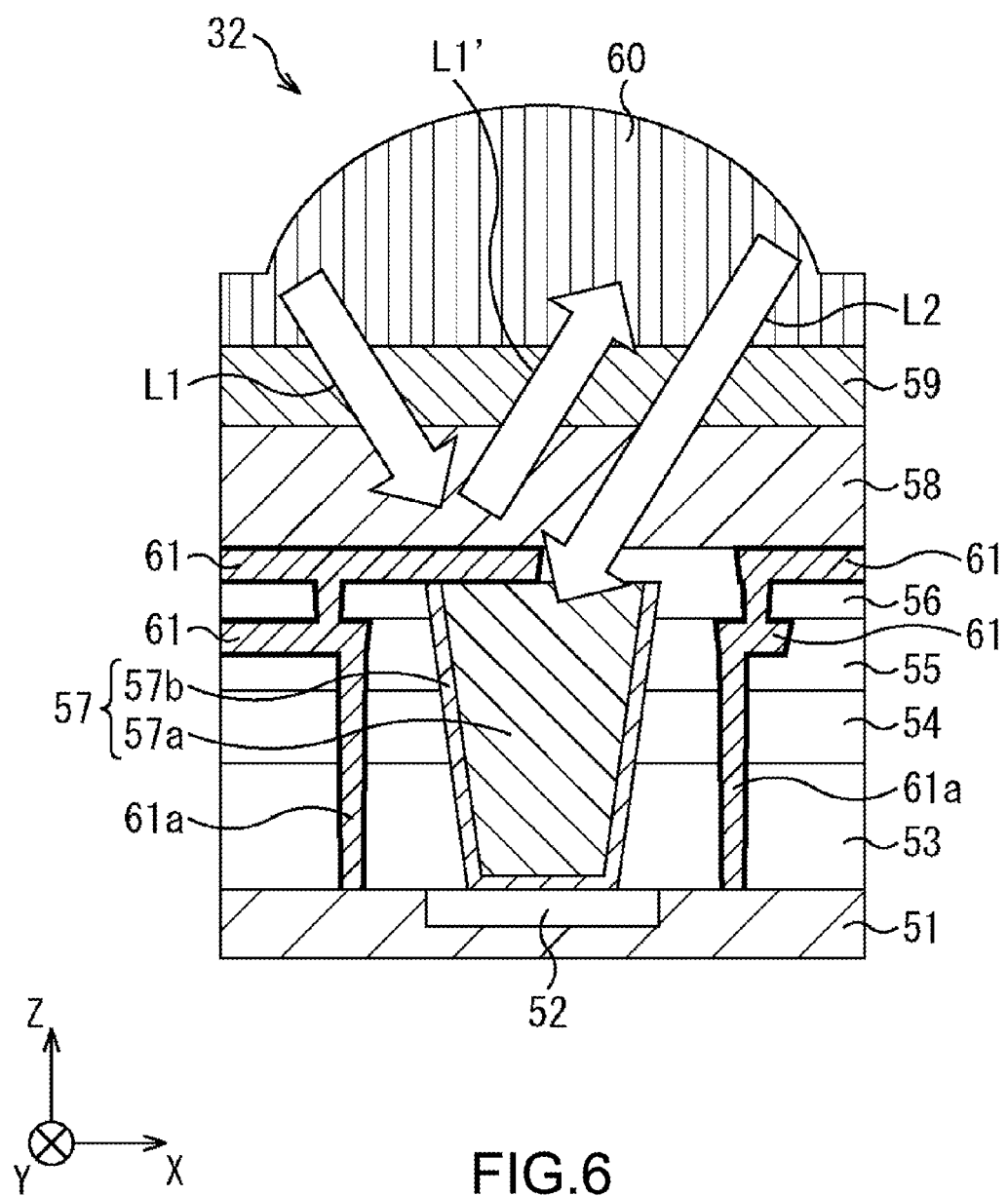
FIG. 6 is a cross-sectional view showing still another configuration example of the phase difference detection pixel.

In the phase difference detection pixel 32 shown in FIG. 6, a part of the wiring layer 61 is formed as a light-shielding section that shields a part of incident light that enters the waveguide 57. This light-shielding section can also be formed to be held in contact with an upper end surface of the core 57a in vicinity of the opening of the waveguide 57.

The wiring layer 61 is formed of a combination of a plurality of kinds of metal such as Cu serving as a conductive portion and Ta and TaN serving as a barrier layer that prevents diffusion of Cu.

Also with such a configuration, the phase difference detection pixel 32 can improve the easiness of fabrication and the distance measuring accuracy.

[Still Another Configuration Example of Phase Difference Detection Pixel]

Next, referring to FIG. 7, a still another configuration example of the phase difference detection pixel 32 will be described.

Figure 7:
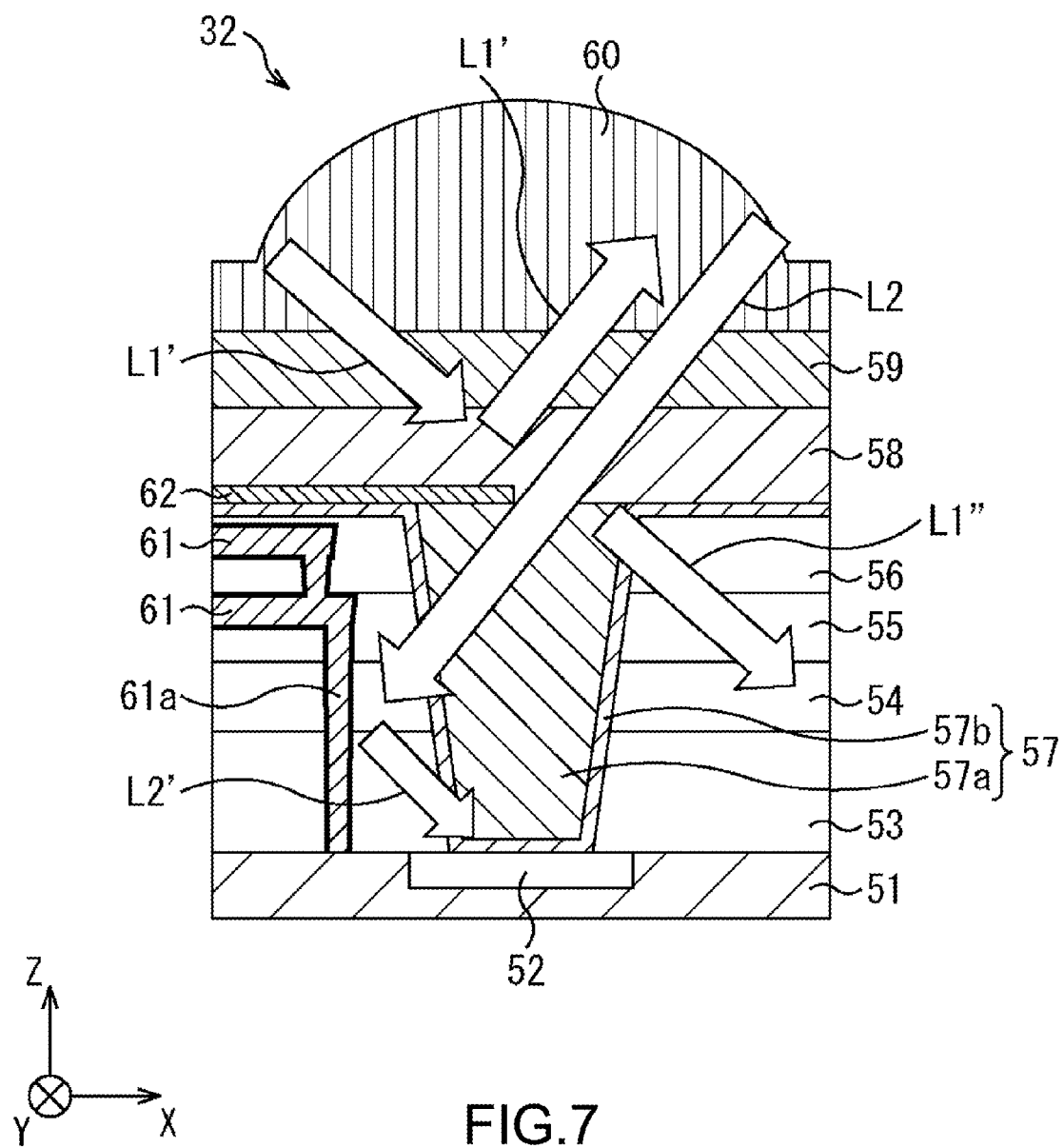
FIG. 7 is a cross-sectional view showing still another configuration example of the phase difference detection pixel.

In the phase difference detection pixel 32 shown in FIG. 7, the light-shielding wall 61a is formed to surround only a part of the periphery of the waveguide 57 (in this example, left half of periphery of waveguide 57).

As shown in FIG. 7, most of the incident light L1 that have passed through the on-chip lens 60 and entered in the first direction is reflected by the light-shielding section 62 as the reflection light L1' and the remaining light L1" leaks out to adjacent pixels due to the absence of the light-shielding wall 61a. Thus, the incident light L1 does not enter the photoelectric conversion section 52. Note that the light L1" that have leaked out to the adjacent pixels can be prevented from entering the photoelectric conversion sections 52 in the adjacent pixels by providing the light-shielding walls 61a in the adjacent pixels or improving the pixel arrangement of the pixel array section.

On the other hand, most of the incident light L2 that have passed through the on-chip lens 60 and entered in the second direction passes through the opening portion of the waveguide 57 and is guided by the waveguide 57 to the photoelectric conversion section 52. In this case, light of the incident light L2, which has leaked out of the waveguide 57, is reflected by the light-shielding wall 61a as reflection light L2' and enters the photoelectric conversion section 52.

By the light-shielding wall 61a surrounding only the part of the periphery of the waveguide 57 in this manner, it is possible to efficiently split light coming in a predetermined direction, and thus to further improve the distance measuring accuracy.

Note that the configuration described with reference to FIG. 7 may be applied to the configuration described with reference to FIG. 6.

Although, in the above-mentioned configurations, the phase difference detection pixel takes a configuration of shielding light on the right- and left-hand sides, the phase difference detection pixel may take, depending on the pixel arrangement, a configuration of shielding light on upper and lower sides or light may be obliquely shielded.

Embodiments of the present technology are not limited to the above-mentioned embodiment and may be variously modified without departing from the gist of the present technology.

In addition, the present technology may also take the following configurations.

(1) A solid-state imaging apparatus, including
  a phase difference detection pixel including
    a photoelectric conversion section that is formed on a semiconductor substrate and configured to photoelectrically convert incident light,
    a waveguide configured to guide the incident light to the photoelectric conversion section, and a light-shielding section that is formed in vicinity of an opening of the waveguide and configured to shield a part of the incident light that enters the waveguide.
(2) The solid-state imaging apparatus according to (1), in which
the phase difference detection pixel further includes
an on-chip lens having a light collection point in vicinity of the opening of the waveguide.
(3) The solid-state imaging apparatus according to (2), in which
the phase difference detection pixel further includes
a light-shielding wall that is formed in a periphery of the waveguide and configured to shield at least a part of light that leaks out of the waveguide.
(4) The solid-state imaging apparatus according to (3), in which
the light-shielding wall is formed to surround the entire periphery of the waveguide.
(5) The solid-state imaging apparatus according to (3), in which
the light-shielding wall is formed to surround a part of the periphery of the waveguide.
(6) The solid-state imaging apparatus according to (3), in which
the phase difference detection pixel further includes
a charge retention section that is formed on the semiconductor substrate and configured to retain a charge photoelectrically converted by the photoelectric conversion section, and
the light-shielding wall is configured to shield light that leaks out of the waveguide to the charge retention section.
(7) The solid-state imaging apparatus according to any one of (2) to (6), in which
the light-shielding section is formed as a wiring layer.
(8) The solid-state imaging apparatus according to any one of (2) to (7), in which
the waveguide includes a core configured to propagate light and a clad configured to confine the light propagating in the core, and
the light-shielding section is formed to be held in contact with the core in vicinity of the opening of the waveguide.
(9) The solid-state imaging apparatus according to (8), in which
the core and the clad are each formed of an inorganic film, and
the core has a refractive index higher than a refractive index of the clad.
(10) The solid-state imaging apparatus according to any one of (2) to (9), further including
a pixel array section including the phase difference detection pixel arranged in a scattered manner among a plurality of imaging pixels two-dimensionally arranged in rows, in which
the plurality of imaging pixels each include at least the photoelectric conversion section, the waveguide, and the on-chip lens.
(11) An electronic apparatus, including
a solid-state imaging apparatus including
a phase difference detection pixel including
a photoelectric conversion section that is formed on a semiconductor substrate and configured to photoelectrically convert incident light,
a waveguide configured to guide the incident light to the photoelectric conversion section, and
a light-shielding section that is formed in vicinity of an opening of the waveguide and configured to shield a part of the incident light that enters the waveguide.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging apparatus comprising: an on-chip lens that receives incident light, a first portion of the incident light and a second portion of the incident light are transmitted through the on-chip lens; a waveguide that guides the first portion of the incident light onto a photoelectric conversion section of a semiconductor substrate, the waveguide is between the semiconductor substrate and the on-chip lens; a light-shielding section that prevents the second portion of the incident light from reaching the waveguide, a portion of the light-shielding section is between the waveguide and the on-chip lens; a different waveguide that guides the incident light onto a different photoelectric conversion section of the semiconductor substrate, the different waveguide is between the semiconductor substrate and a different on-chip lens, wherein no light-shielding section is between the different waveguide and the different on-chip lens and wherein no light-shielding section is between the different waveguide and the different on-chip lens and wherein the different photoelectric conversion section is adjacent to the photoelectric conversion section.

2. The solid-state imaging apparatus according to claim 1, wherein the light-shielding section reflects the second portion of the incident light away from the waveguide.

3. The solid-state imaging apparatus according to claim 1, wherein the light-shielding section includes a metal.

4. The solid-state imaging apparatus according to claim 1, wherein the light-shielding section is a material from the group consisting of W, Ti, Al, Cu, TiN, Ta, and TaN.

5. The solid-state imaging apparatus according to claim 1, wherein the on-chip lens is configured to guide the first portion of the incident light toward the waveguide and to guide the second portion of the incident light toward the waveguide.

6. The solid-state imaging apparatus according to claim 1, wherein the photoelectric conversion section is configured to photoelectrically convert the first portion of the incident light into a charge.

7. The solid-state imaging apparatus according to claim 1, wherein an opening extends through the light-shielding section.

8. The solid-state imaging apparatus according to claim 7, wherein the opening is between the waveguide and the on-chip lens.

9. The solid-state imaging apparatus according to claim 8, wherein the first portion of the incident light is transmissible through the opening.

10. The solid-state imaging apparatus according to claim 1, wherein a clad of the waveguide surrounds a core of the waveguide, the core has a refractive index higher than a refractive index of the clad.

11. The solid-state imaging apparatus according to claim 10, wherein the core and the clad are material having a transmittance of 80% or higher against a wavelength band of the incident light.

12. The solid-state imaging apparatus according to claim 10, wherein the clad is between the core and a light-shielding wall, the light-shielding wall and the waveguide are in an inter-layer.

13. The solid-state imaging apparatus according to claim 12, wherein the light-shielding wall surrounds the waveguide.

14. The solid-state imaging apparatus according to claim 12, wherein the inter-layer has a refractive index that is lower than a refractive index of the waveguide.

15. The solid-state imaging apparatus according to claim 12, wherein the inter-layer is between the semiconductor substrate and the on-chip lens.

16. An electronic apparatus comprising:
   the solid-state imaging apparatus according to claim 1;
   a signal processing unit that converts an electrical signal into data;
   wherein the photoelectric conversion section is configured to photoelectrically convert the incident light into the electrical signal.

17. The electronic apparatus according to claim 16, further comprising:
   a focus determination unit that uses the data to determine whether or not an object as a target to be focused is in focus.

\* \* \* \* \*